United States Patent
Kang et al.

(10) Patent No.: US 10,687,416 B2
(45) Date of Patent: Jun. 16, 2020

(54) POWER SUPPLY DEVICE HAVING MULTIPLE POWER MODULES PHYSICALLY CONNECTED WITH EACH OTHER AND ELECTRONIC DEVICE COMPRISING THE SAME

(71) Applicant: SAMSUNG ELECTRONICS CO., LTD., Suwon-si (KR)

(72) Inventors: Shin Ho Kang, Incheon (KR); Sung Yong Joo, Hwaseong-si (KR); Yong Joo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/883,253

(22) Filed: Jan. 30, 2018

(65) Prior Publication Data
US 2018/0228021 A1    Aug. 9, 2018

(30) Foreign Application Priority Data

Feb. 6, 2017    (KR) .................. 10-2017-0015990

(51) Int. Cl.
*H05K 1/02*    (2006.01)
*H05K 1/14*    (2006.01)
(Continued)

(52) U.S. Cl.
CPC ........... *H05K 1/0269* (2013.01); *G01R 31/40* (2013.01); *G01R 31/50* (2020.01); *H05K 1/0231* (2013.01);
(Continued)

(58) Field of Classification Search
CPC ...... H05K 1/0269; H05K 1/0231; H05K 1/14; H05K 1/181; H05K 5/0017; H05K 7/1427; H05K 1/142; H05K 2201/09081
See application file for complete search history.

(56) References Cited

U.S. PATENT DOCUMENTS

| 5,219,292 A | 6/1993 | Dickirson et al. |
| 6,444,923 B1 | 9/2002 | Iriguchi et al. |

(Continued)

FOREIGN PATENT DOCUMENTS

| DE | 102016224653 A1 * | 6/2018 |
| EP | 1624507 A1 | 2/2006 |

(Continued)

OTHER PUBLICATIONS

Greifenstein Thengis, English Translation of DE-102016224653-A1, Jun. 2018, DE (Year: 2018).*

(Continued)

*Primary Examiner* — Daniel P Wicklund
*Assistant Examiner* — Douglas R Burtner
(74) *Attorney, Agent, or Firm* — Sughrue Mion, PLLC

(57) ABSTRACT

A power supply device includes a first power module including a first printed circuit board in which a first protrusion part is formed along a first side surface of the first printed circuit board facing a first direction, a second power module including a second printed circuit board in which a first groove is formed along a second side surface of the printed circuit board facing the first side surface of the first printed circuit board in a second direction, and a third power module including a third printed circuit board electrically connecting the first printed circuit board and the second printed circuit board. The first protrusion part is inserted into the first groove to physically connect the first printed circuit board to the second printed circuit board.

14 Claims, 11 Drawing Sheets

(51) Int. Cl.
 H05K 1/18 (2006.01)
 H05K 7/14 (2006.01)
 G01R 31/40 (2020.01)
 H05K 5/00 (2006.01)
 G01R 31/50 (2020.01)

(52) U.S. Cl.
 CPC ............... *H05K 1/14* (2013.01); *H05K 1/181* (2013.01); *H05K 5/0017* (2013.01); *H05K 7/1427* (2013.01); *H05K 1/142* (2013.01); *H05K 2201/09081* (2013.01); *H05K 2201/10106* (2013.01); *H05K 2203/176* (2013.01)

(56) References Cited

U.S. PATENT DOCUMENTS

| | | | |
|---|---|---|---|
| 6,805,560 B1 | 10/2004 | Budny et al. | |
| 7,275,935 B2 | 10/2007 | Chen et al. | |
| 7,413,481 B2* | 8/2008 | Redmond | H05K 1/142 |
| | | | 439/717 |
| 7,834,962 B2* | 11/2010 | Satake | G02F 1/133305 |
| | | | 349/110 |
| D759,589 S | 6/2016 | Shimura et al. | |
| 9,367,109 B2 | 6/2016 | Irish et al. | |
| 9,370,994 B2 | 6/2016 | Yokoyama et al. | |
| 9,374,925 B2 | 6/2016 | Mills et al. | |
| 9,380,728 B1 | 6/2016 | Dunwoody et al. | |
| 9,380,733 B2 | 6/2016 | Nagata et al. | |
| 2002/0127903 A1* | 9/2002 | Billman | H01R 12/724 |
| | | | 439/378 |
| 2002/0132477 A1* | 9/2002 | Billman | H01R 13/6594 |
| | | | 438/680 |
| 2002/0137373 A1* | 9/2002 | Billman | H01R 13/631 |
| | | | 439/108 |
| 2002/0142675 A1* | 10/2002 | Billman | H01R 13/631 |
| | | | 439/862 |
| 2005/0048805 A1 | 3/2005 | Budny et al. | |
| 2005/0068261 A1* | 3/2005 | Oh | H01R 4/64 |
| | | | 345/60 |
| 2005/0186807 A1 | 8/2005 | Budny et al. | |
| 2006/0194460 A1 | 8/2006 | Chen et al. | |
| 2006/0289201 A1 | 12/2006 | Kim et al. | |
| 2013/0266823 A1* | 10/2013 | Lee | H01M 2/34 |
| | | | 429/7 |
| 2014/0022737 A1* | 1/2014 | Hsiao | H05K 7/1432 |
| | | | 361/729 |
| 2015/0019882 A1 | 1/2015 | Irish et al. | |
| 2015/0062830 A1 | 3/2015 | Mills et al. | |
| 2015/0210157 A1 | 7/2015 | Yokoyama et al. | |
| 2015/0382509 A1 | 12/2015 | Nagata et al. | |
| 2016/0013570 A1* | 1/2016 | Fry, Jr. | H01R 24/84 |
| | | | 439/78 |
| 2016/0192530 A1 | 6/2016 | Dunwoody et al. | |
| 2017/0127540 A1* | 5/2017 | You | H05K 9/0007 |
| 2017/0215287 A1* | 7/2017 | Westphall | H05K 7/1487 |

FOREIGN PATENT DOCUMENTS

| | | |
|---|---|---|
| GB | 357171 A | 9/1931 |
| JP | 2013-197455 A | 9/2013 |
| JP | 2016-171218 A | 9/2016 |

OTHER PUBLICATIONS

International Search Report and Written Opinion (PCT/ISA/210 and PCT/ISA/237), dated May 4, 2018 by International Searching Authority in International Application No. PCT/KR2018/001029.
Communication dated Oct. 29, 2019, from the European Patent Office in counterpart European Application No. 18748484.5.

* cited by examiner

US 10,687,416 B2

POWER SUPPLY DEVICE HAVING MULTIPLE POWER MODULES PHYSICALLY CONNECTED WITH EACH OTHER AND ELECTRONIC DEVICE COMPRISING THE SAME

CROSS-REFERENCE TO RELATED APPLICATION(S)

This application claims priority from Korean patent application filed on Feb. 6, 2017 in the Korean Intellectual Property Office and assigned Serial number 10-2017-0015990, the entire disclosure of which is hereby incorporated by reference.

TECHNICAL FIELD

The present disclosure relates to a power supply device supplying power to an electronic device, and an electronic device including the power supply device.

BACKGROUND

A power supply device placed in an electronic device may supply power to the electronic device. Alternatively, a power supply device placed out of the electronic device may be connected to the electronic device to supply power to the electronic device. The power supply device may convert alternating current (AC) power received from an external power source into direct current (DC) power to supply power to various configurations included in the electronic device.

For the purpose of stably supplying power to an electronic device, a power supply device may include various modules. In the case where the power supply device is implemented with one package including various modules, even though an error occurs in some of the various modules, it may be difficult to intuitively grasp which module has an error. Accordingly, a user needs to replace the whole of the power supply device newly.

SUMMARY

According to an aspect of an exemplary embodiment, there is provided a power supply device comprising: a first power module comprising a first printed circuit board comprising a first protrusion part formed along a first side surface of the first printed circuit board facing a first direction; a second power module comprising a second printed circuit board comprising a first groove formed along a second side surface of the second printed circuit board facing the first side surface of the first printed circuit board in a second direction; and a third power module comprising a third printed circuit board configured to electrically connect the first printed circuit board and the second printed circuit board, wherein the first protrusion part is configured to be inserted into the first groove to physically connect the first printed circuit board to the second printed circuit board.

The first groove may be formed in an oblique direction with respect to an upper surface or a lower surface of the second printed circuit board.

The first printed circuit board may be a single-layer printed circuit board.

The second printed circuit board may be a multilayer printed circuit board.

The third printed circuit board may be a single-layer printed circuit board.

A dummy pattern having strength higher than specified strength may be formed on at least one of an upper portion and a lower portion of the first groove inside the second printed circuit board.

The third power module may comprise: at least one capacitor disposed on the third printed circuit board and may be configured to reduce electromagnetic interference (EMI).

The first power module may comprise: at least one light emitting diode (LED) disposed on the first printed circuit board and may be configured to turn on or off based on an operating state of the first power module.

The second power module may comprise: at least one LED disposed on the second printed circuit board and may be configured to turn on or off based on an operating state of the second power module.

The power supply device may further comprise: a fixing member coupled to the first printed circuit board and the second printed circuit board and configured to fixedly hold the first printed circuit board and the second printed circuit board.

The power supply device may further comprise: a first connection member comprising a first conductive material and configured to electrically connect the first printed circuit board and the third printed circuit board; and a second connection member comprising a second conductive material and configured to electrically connect the second printed circuit board and the third printed circuit board.

The power supply device may further comprise: a fourth power module comprising a fourth printed circuit board comprising a second protrusion part formed along a fourth side surface of the fourth printed circuit board facing a third side surface of the second printed circuit board, wherein the second printed circuit board may further comprise a second groove formed along the third side surface facing a direction different from the second direction faced by the second side surface of the second printed circuit board, and wherein the second protrusion part may be configured to be inserted into the second groove to connect the fourth printed circuit board to the second printed circuit board.

The fourth printed circuit board may be a single-layer printed circuit board.

According to an aspect of another exemplary embodiment, there is provided a power supply device comprising: a first power module comprising a first printed circuit board comprising a plurality of first fixing pins on a first surface of the first printed circuit board facing a first direction; and a second power module comprising a second printed circuit board comprising a plurality of first recesses formed on a second surface of the second printed circuit board facing the first surface of the first printed circuit board in a second direction, wherein one or more of the plurality of first fixing pins is configured to be inserted into one or more of the plurality of first recesses, respectively, to electrically connect the first printed circuit board to the second printed circuit board.

The first power module may comprise: a first housing member surrounding a periphery of the first power module and configured to house the first power module.

The second power module may comprise: a second housing member surrounding a periphery of the second power module and configured to house the second power module.

The first printed circuit board may be a single-layer printed circuit board.

The second printed circuit board may be a multilayer printed circuit board.

The one or more of the plurality of first fixing pins may have a first height, the one or more of the plurality of first recesses may be formed over an area from a first point of the second surface to a second point of the second surface.

The one or more of the plurality of first recesses may have a second height at the first point, the second height being higher than the first height.

The one or more of the plurality of first recesses may have a third height at the second point, the third height being lower than the first height.

The one or more of the plurality of first fixing pins may be configured to be respectively inserted into the one or more of the plurality of first recesses from the first point to fix the one or more of the plurality of first fixing pins at a third point between the first point and the second point.

The first power module may comprise: at least one LED disposed on the first printed circuit board and configured to turn on or off based on an operating state of the first power module.

The second power module may comprise: at least one LED disposed on the second printed circuit board and configured to turn on or off based on an operating state of the second power module.

The power supply device may further comprise: a third power module comprising a third printed circuit board comprising a plurality of second recesses formed on a fourth surface of the third printed circuit board facing a third surface of the second printed circuit board, wherein the second printed circuit board may further comprise a plurality of second fixing pins formed on the third surface facing a direction different from the second direction faced by the second surface of the second printed circuit board, and wherein one or more of the plurality of second fixing pins may be configured to be respectively inserted into one or more of the plurality of second recesses to electrically connect to the third printed circuit board to the second printed circuit board.

The third printed circuit board may be a multilayer printed circuit board.

According to an aspect of another exemplary embodiment, there is provided an electronic device comprising: a housing member configured to house the electronic device; a display exposed to the outside through the housing member; and a power supply device disposed inside the housing member and configured to supply power to the display, wherein the power supply device may comprise: a first power module comprising a first printed circuit board having a first protrusion part formed along a first side surface of the first printed circuit board facing a first direction; a second power module comprising a second printed circuit board having a first groove formed along a second side surface of the second printed circuit board facing the first side surface of the first printed circuit board in a second direction; and a third power module comprising a third printed circuit board configured to electrically connect the first printed circuit board and the second printed circuit board, wherein the first protrusion part is configured to be inserted into the first groove to physically connect the first printed circuit board to the second printed circuit board.

The display may include a curved display, and wherein the first groove may be formed in an oblique direction with respect to an upper surface or a lower surface of the second printed circuit board.

According to one or more exemplary embodiments of the present disclosure, a user may easily determine which of the plurality of modules included in the power supply device has failed, and may easily repair the power supply device by replacing only the broken-down module.

According to one or more exemplary embodiments of the present disclosure, a plurality of modules included in the power supply device may be coupled to each other with an intersection angle, and may be disposed along a curved surface of the display in an electronic device having the curved display.

According to one or more exemplary embodiments of the present disclosure, since at least part of elements included in the power supply device may be applied in common to various electronic devices, the power consumption of each being similar to one another, the power supply device may be applied to the various electronic devices only by changing the design of some configurations.

Other aspects, advantages, and salient features of the disclosure will become apparent to those skilled in the art from the following detailed description, which, taken in conjunction with the annexed drawings, discloses various exemplary embodiments of the present disclosure.

BRIEF DESCRIPTION OF THE DRAWINGS

The above and other aspects, features, and advantages of certain exemplary embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
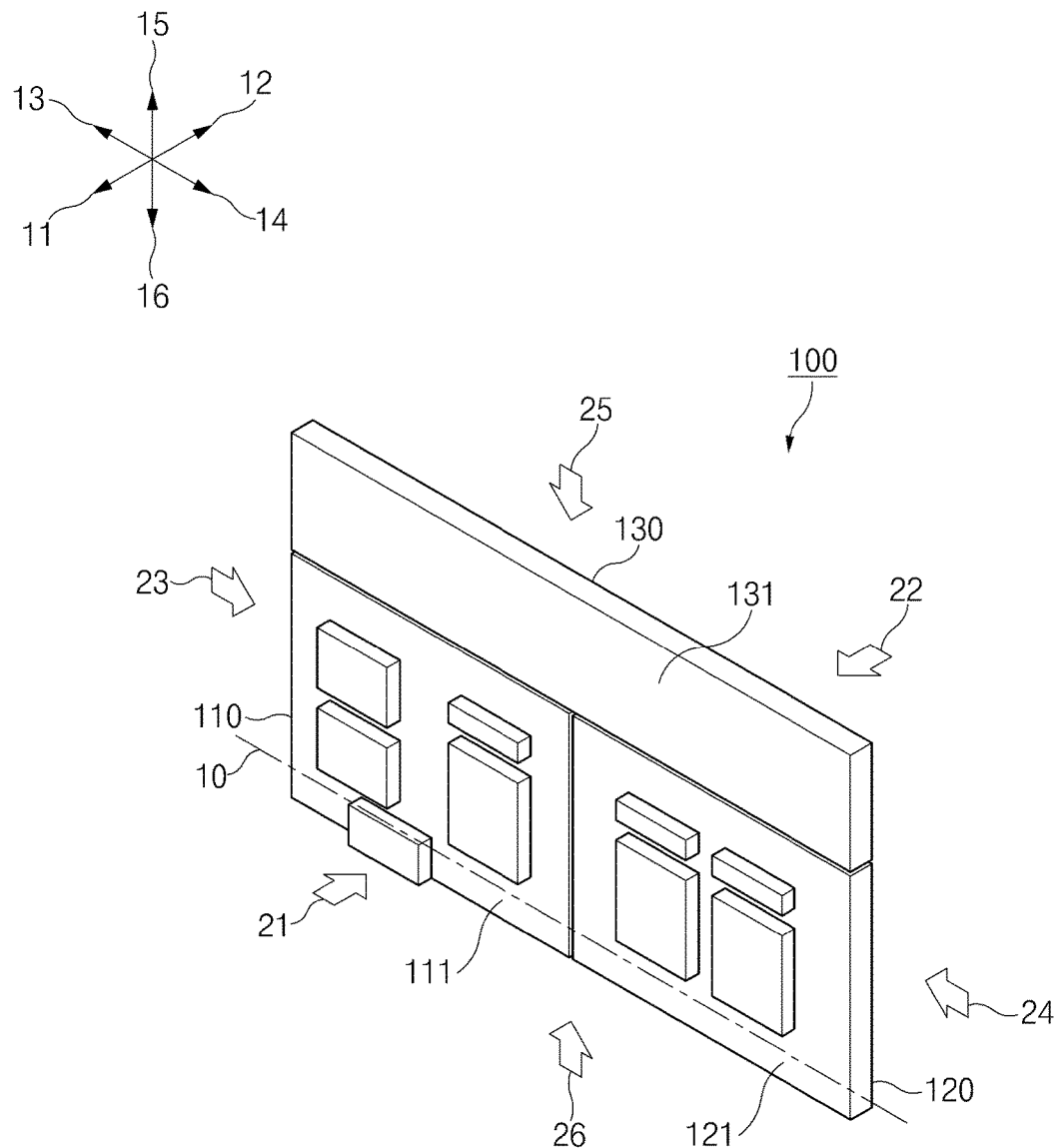
FIG. 1 is a view illustrating a structure of a power supply device, according to an exemplary embodiment of the present disclosure.

Hereinafter, various exemplary embodiments of the present disclosure will be described with reference to accompanying drawings. However, those of ordinary skill in the art will recognize that modification, equivalent, and/or alternative on the various exemplary embodiments described herein can be variously made without departing from the scope and spirit of the present disclosure. With regard to description of drawings, similar elements may be marked by similar reference numerals.

FIG. 1 is a view illustrating a structure of a power supply device, according to an exemplary embodiment of the present disclosure.

Referring to FIG. 1, a power supply device 100 may include a first power module 110, a second power module 120, and a third power module 130. According to an exemplary embodiment, the power supply device 100 may be disposed in an electronic device (e.g., a display device) to supply power to each of the power modules included in the electronic device. For example, the power supply device 100 may be disposed in housing forming the outer appearance of a display device, and may supply the power to the display exposed to the outside through the housing. The first power module 110, the second power module 120, and the third power module 130 may include printed circuit boards (PCBs) 111, 121, and 131, respectively and various circuits or modules may be disposed on the PCBs 111, 121, and 131. According to an exemplary embodiment, the PCBs 111, 121, and 131 may be a single-layer PCB or a multilayer PCB. For example, the first PCB 111 may be a single-layer or multi-layer PCB, the second PCB 121 may be a multilayer PCB, and the third PCB 131 may be a single-layer PCB.

According to an exemplary embodiment, the power supply device 100 may include a front surface 21 facing a first direction (or a front direction 11), a rear surface 22 that is opposite to the front surface 21 and faces a second direction (or a rear direction 12), and a side surface surrounding at least a partial space between the front surface 21 and the rear surface 22. The side surface may include a left-side surface 23 facing a third direction (or a left-side direction 13), a right-side surface 24 facing a fourth direction (or a right-side direction 14), an upper-side surface 25 facing a fifth direction (or an upper-side direction 15), and a bottom-side surface 26 facing a sixth direction (or a bottom-side direction 16).

According to an exemplary embodiment, the first power module 110 and the second power module 120 may be disposed in the bottom-side direction 16 of the power supply device 100 side by side in the left-side direction 13 or the right-side direction 14. For example, the first power module 110 and the second power module 120 may be disposed such that the right-side surface of the first power module 110 and the left-side surface of the second power module 120 face each other. According to an exemplary embodiment, the first power module 110 and the second power module 120 may be physically connected to each other by the first PCB 111 and the second PCB 121.

According to an exemplary embodiment, the third power module 130 may be disposed in the upper-side direction 15 of the power supply device 100. According to an exemplary embodiment, the third power module 130 may be disposed in the upper-side direction 15 of the first power module 110 and the second power module 120. For example, the third power module 130 may be disposed such that the bottom-side surface of the third power module 130 faces the upper-side surface the first power module 110 and the upper-side surface of the second power module 120. According to an exemplary embodiment, the third PCB 131 included in the third power module 130 may be electrically connected to the first PCB 111 and the second PCB 121. Accordingly, the first PCB 111 and the second PCB 121 may be electrically connected to each other through the third PCB 131.

The plurality of power modules 110, 120, and 130 included in the power supply device 100 may be separately removable from the power supply device 100. For example, each of the power modules 110, 120, and 130 included in the power supply device 100 may be assembled after being manufactured in the separated form, and may be separately replaced.

FIGS. 2A to 2D are views illustrating a coupling structure of PCBs, according to various exemplary embodiments of the present disclosure.

FIGS. 2A to 2D illustrate various examples of sectional views taken along a line 10 across the power supply device 100 illustrated in FIG. 1 in the left-side direction 13 and the right-side direction 14.

Figure 2A:
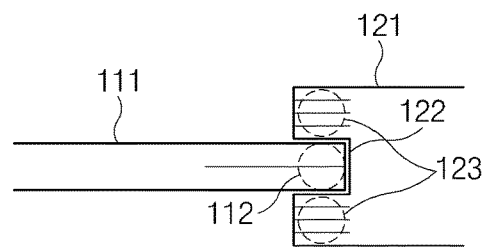
FIGS. 2A to 2D are views illustrating a coupling structure of PCBs, according to various exemplary embodiments of the present disclosure.

Referring to FIG. 2A, the first PCB 111 may be a single-layer PCB, and the second PCB 121 may be a multilayer PCB. According to an exemplary embodiment, the first PCB 111 may include a protrusion part 112, and the second PCB 121 may include a groove 122. The protrusion part 112 may be formed along the right-side surface facing the right-side direction of the first PCB 111, and the groove 122 may be formed along the left-side surface facing the left-side direction of the second PCB 121. The right-side surface of the first PCB 111 and the left-side surface of the second PCB 121 may face each other while being disposed in the power supply device 100. In the case where the first PCB 111 is a single-layer PCB, the protrusion part 112 may correspond to the periphery of one side surface of the first PCB 111.

According to an exemplary embodiment, if the protrusion part 112 of the first PCB 111 is inserted into the groove 122 of the second PCB 121, the first PCB 111 and the second PCB 121 may be physically connected to each other. According to an exemplary embodiment, the second PCB 121 may include a dummy pattern 123 on at least one of the upper portion and the lower portion of the groove 122. The dummy pattern 123 may include a material having strength higher than the specified strength to improve the rigidity of the portion where the protrusion part 112 and the groove 122 are coupled to each other. For example, the dummy pattern 123 may include a metal, a high-strength polymer, or the like.

Figure 2B:
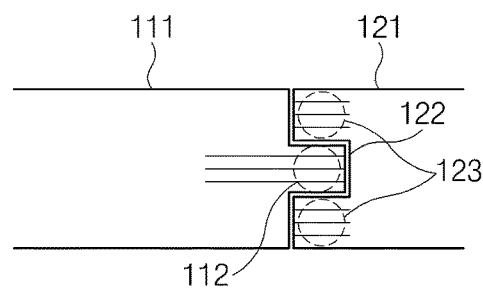

Referring to FIG. 2B, each of the first PCB 111 and the second PCB 121 may be a multilayer PCB. According to an exemplary embodiment, the first PCB 111 may include the protrusion part 112, and the second PCB 121 may include the groove 122. The protrusion part 112 may be formed along the right-side surface facing the right-side direction of the first PCB 111, and the groove 122 may be formed along the left-side surface facing the left-side direction of the second PCB 121. The right-side surface of the first PCB 111 and the left-side surface of the second PCB 121 may face each other while being disposed in the power supply device 100.

According to an exemplary embodiment, if the protrusion part 112 of the first PCB 111 is inserted into the groove 122 of the second PCB 121, the first PCB 111 and the second PCB 121 may be physically connected to each other. According to an exemplary embodiment, the second PCB 121 may include the dummy pattern 123 on at least one of the upper portion and the lower portion of the groove 122. The dummy pattern 123 may include a material having strength higher than the specified strength to improve the rigidity of the portion where the protrusion part 112 and the groove 122 are coupled to each other. For example, the dummy pattern 123 may include a metal, a high-strength polymer, or the like.

Figure 2C:
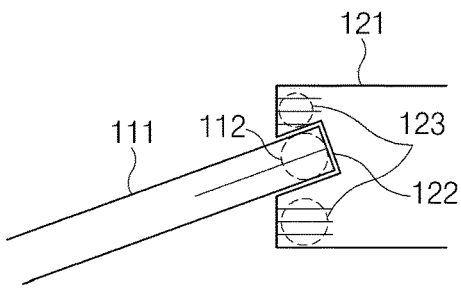

Referring to FIG. 2C, the first PCB 111 may be a single-layer PCB, and the second PCB 121 may be a multilayer PCB. According to an exemplary embodiment, the first PCB 111 may include the protrusion part 112, and the second PCB 121 may include the groove 122. The protrusion part 112 may be formed along the right-side surface facing the right-side direction of the first PCB 111, and the groove 122 may be formed along the left-side surface facing the left-side direction of the second PCB 121. The right-side surface of the first PCB 111 and the left-side surface of the second PCB 121 may face each other while being disposed in the power supply device 100. In the case where the first PCB 111 is a single-layer PCB, the protrusion part 112 may correspond to the periphery of one side surface of the first PCB 111. The groove 122 formed in the second PCB 121 may be formed obliquely in a direction of the upper surface (e.g., the front surface 21 of FIG. 1) or the lower surface (e.g., the rear surface 22 of FIG. 1) of the second PCB 121. For example, referring to FIG. 2C, the groove 122 may be formed obliquely in a direction of the upper surface of the second PCB 121.

According to an exemplary embodiment, if the protrusion part 112 of the first PCB 111 is inserted into the groove 122 of the second PCB 121, the first PCB 111 and the second PCB 121 may be physically connected to each other. The protrusion part 112 may be inserted depending on an angle at which the groove 122 is formed, and the first PCB 111 and the second PCB 121 may be coupled to each other obliquely with an intersection angle.

According to an exemplary embodiment, the second PCB 121 may include the dummy pattern 123 on at least one of the upper portion and the lower portion of the groove 122. The dummy pattern 123 may include a material having strength higher than the specified strength to improve the rigidity of the portion where the protrusion part 112 and the groove 122 are coupled to each other. For example, the dummy pattern 123 may include a metal, a high-strength polymer, or the like.

Figure 2D:
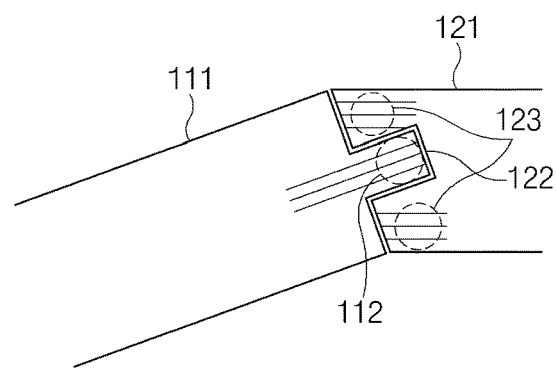

Referring to FIG. 2D, each of the first PCB 111 and the second PCB 121 may be a multilayer PCB. According to an exemplary embodiment, the first PCB 111 may include the protrusion part 112, and the second PCB 121 may include the groove 122. The protrusion part 112 may be formed along the right-side surface facing the right-side direction of the first PCB 111, and the groove 122 may be formed along the left-side surface facing the left-side direction of the second PCB 121. The right-side surface of the first PCB 111 and the left-side surface of the second PCB 121 may face each other while being disposed in the power supply device 100. The groove 122 formed in the second PCB 121 may be formed obliquely in a direction of the upper surface (e.g., the front surface 21 of FIG. 1) or the lower surface (e.g., the rear surface 22 of FIG. 1) of the second PCB 121. For example, referring to FIG. 2D, the groove 122 may be formed obliquely in a direction of the upper surface of the second PCB 121.

According to an exemplary embodiment, if the protrusion part 112 of the first PCB 111 is inserted into the groove 122 of the second PCB 121, the first PCB 111 and the second PCB 121 may be physically connected to each other. The protrusion part 112 may be inserted depending on an angle at which the groove 122 is formed, and the first PCB 111 and the second PCB 121 may be coupled to each other obliquely with an intersection angle.

According to an exemplary embodiment, the second PCB 121 may include the dummy pattern 123 on at least one of the upper portion and the lower portion of the groove 122. The dummy pattern 123 may include a material having strength higher than the specified strength to improve the rigidity of the portion where the protrusion part 112 and the groove 122 are coupled to each other. For example, the dummy pattern 123 may include a metal, a high-strength polymer, or the like.

According to an exemplary embodiment described with reference to FIGS. 2C and 2D, the first power module 110 and the second power module 120 may be coupled obliquely to each other with an intersection angle. As such, the power supply device 100 may be disposed along the curved surface of the display in an electronic device having a curved display.

Figure 3:
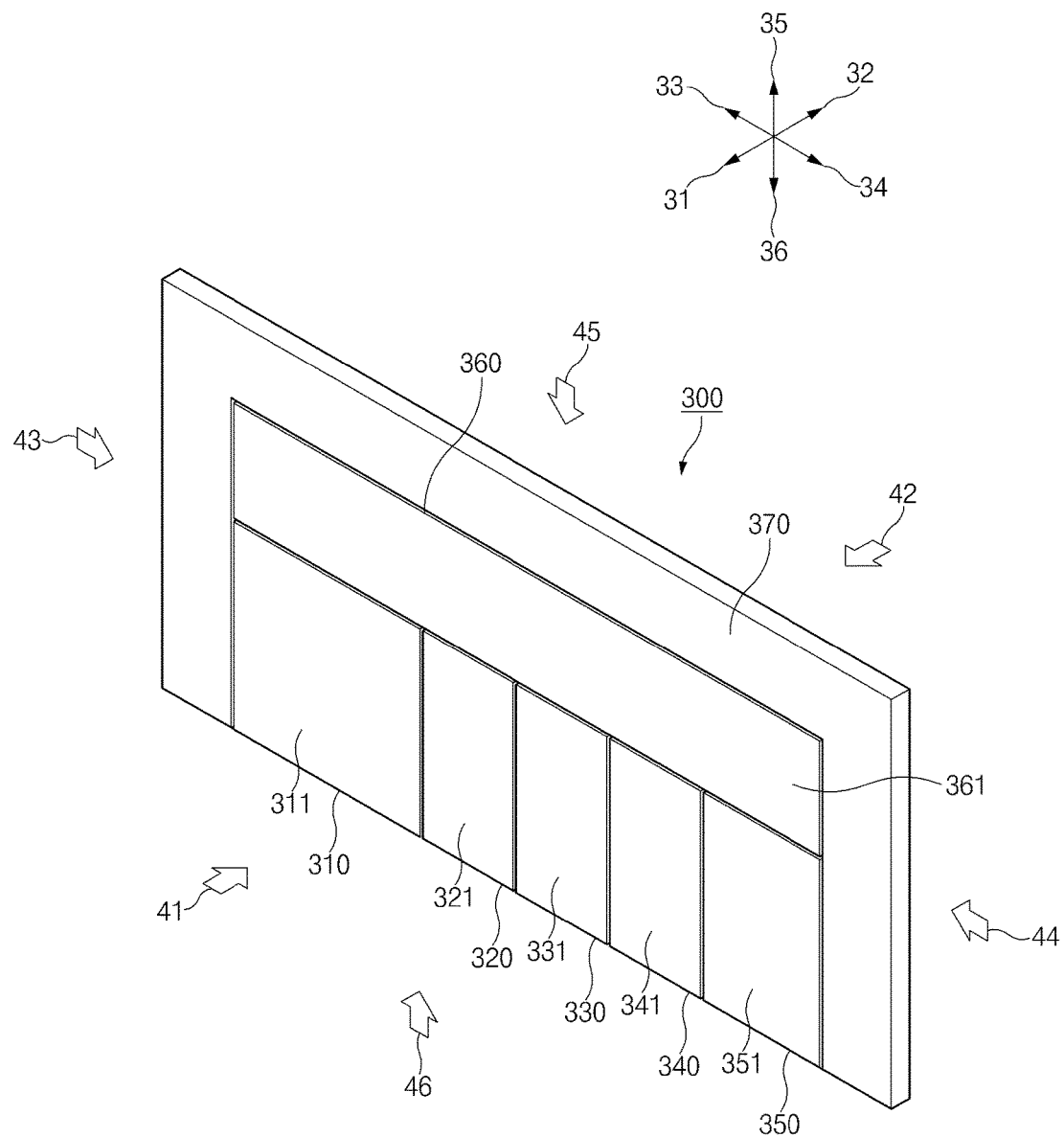
FIG. 3 is a view illustrating a structure of a power supply device, according to an exemplary embodiment of the present disclosure.

FIG. 3 is a view illustrating a structure of a power supply device, according to an exemplary embodiment of the present disclosure.

Referring to FIG. 3, a power supply device 300 may include a first power module 310, a second power module 320, a third power module 330, a fourth power module 340, a fifth power module 350, and a sixth power module 360. Each of the first power module 310, the second power module 320, the third power module 330, the fourth power module 340, the fifth power module 350, and the sixth power module 360 may include a PCB, and various circuits or modules may be disposed on PCBs 311, 321, 331, 341, 351, and 361. According to an exemplary embodiment, each of the PCBs 311, 321, 331, 341, 351, and 361 may be a single-layer PCB or a multilayer PCB. For example, the first PCB 311 may be a single-layer PCB, the second PCB 321 may be a multilayer PCB, the third PCB 331 may be a single-layer PCB, the fourth PCB 341 may be a multilayer PCB, the fifth PCB 351 may be a single-layer PCB, and the sixth PCB 361 may be a single-layer PCB.

According to an exemplary embodiment, the power supply device 100 may include a front surface 41 facing a first direction (or a front direction 31), a rear surface 42 that is opposite to the front surface 41 and faces a second direction (or a rear direction 32), and a side surface surrounding at least a partial space between the front surface 41 and the rear surface 42. The side surface may include a left-side surface 43 facing a third direction (or a left-side direction 33), a right-side surface 44 facing a fourth direction (or a right-side direction 34), an upper-side surface 45 facing a fifth direction (or an upper-side direction 35), and a bottom-side surface 46 facing a sixth direction (or a bottom-side direction 36).

According to an exemplary embodiment, the first power module 310, the second power module 320, the third power module 330, the fourth power module 340, and the fifth power module 350 may be disposed in the bottom-side direction 36 of the power supply device 300 side by side in the left-side direction 33 or the right-side direction 34. According to an exemplary embodiment, the first power module 310, the second power module 320, the third power module 330, the fourth power module 340, and the fifth power module 350 may be physically connected to each other by the PCBs 311, 321, 331, 341, and 351. For example, the first power module 310 and the second power module 320 may be connected to each other by the first PCB 311 and the second PCB 312. The second power module 320 and the third power module 330 may be connected to each other by the second PCB 321 and the third PCB 331. The third power module 330 and the fourth power module 340 may be connected to each other by the third PCB 331 and the fourth PCB 341. The fourth power module 340 and the fifth power module 350 may be connected to each other by the fourth PCB 341 and the fifth PCB 351.

According to an exemplary embodiment, the sixth power module 360 may be disposed in the upper-side direction 35 of the power supply device 300. According to an exemplary embodiment, the sixth power module 360 may be disposed in the upper-side direction 35 of each of the first power module 310, the second power module 320, the third power module 330, the fourth power module 340, and the fifth power module 350. For example, the sixth power module 360 may be disposed such that the bottom-side surface of the sixth power module 360 faces upper-side surfaces of the first power module 310, the second power module 320, the third power module 330, the fourth power module 340, and the fifth power module 350. According to an exemplary embodiment, the sixth PCB 361 included in the sixth power module 360 may be electrically connected to the first PCB 311, the second PCB 321, the third PCB 331, the fourth PCB 341, and the fifth PCB 351. As such, the first PCB 311, the second PCB 321, the third PCB 331, the fourth PCB 341, and the fifth PCB 351 may be connected to each other through the sixth PCB 361.

According to an exemplary embodiment, the power supply device 300 may include a side surface fixing member 370. According to an exemplary embodiment, the side surface fixing member 370 may be disposed over at least one side surface of the power supply device 300. For example, the side surface fixing member 370 may be disposed on the left-side surface 43, the right-side surface 44, and upper-side surface 45 of the power supply device 300 so as to surround the first power module 310, the fifth power module 350, and the sixth power module 360, and may prevent the power modules included in the power supply device 300 from moving. According to an exemplary embodiment, the side surface fixing member 370 not only may fix the power modules included in the power supply device 300 but also may fix the power supply device 300 in an electronic device when the power supply device 300 is disposed in the electronic device.

According to an exemplary embodiment, the first to fifth power modules 310, 320, 330, 340, and 350 may be separately removable from the power supply device 300. For example, the first to fifth power modules 310, 320, 330, 340, and 350 may be removable in the bottom-side direction 36 or the upper-side direction 35 of the power supply device 300.

Figure 4:
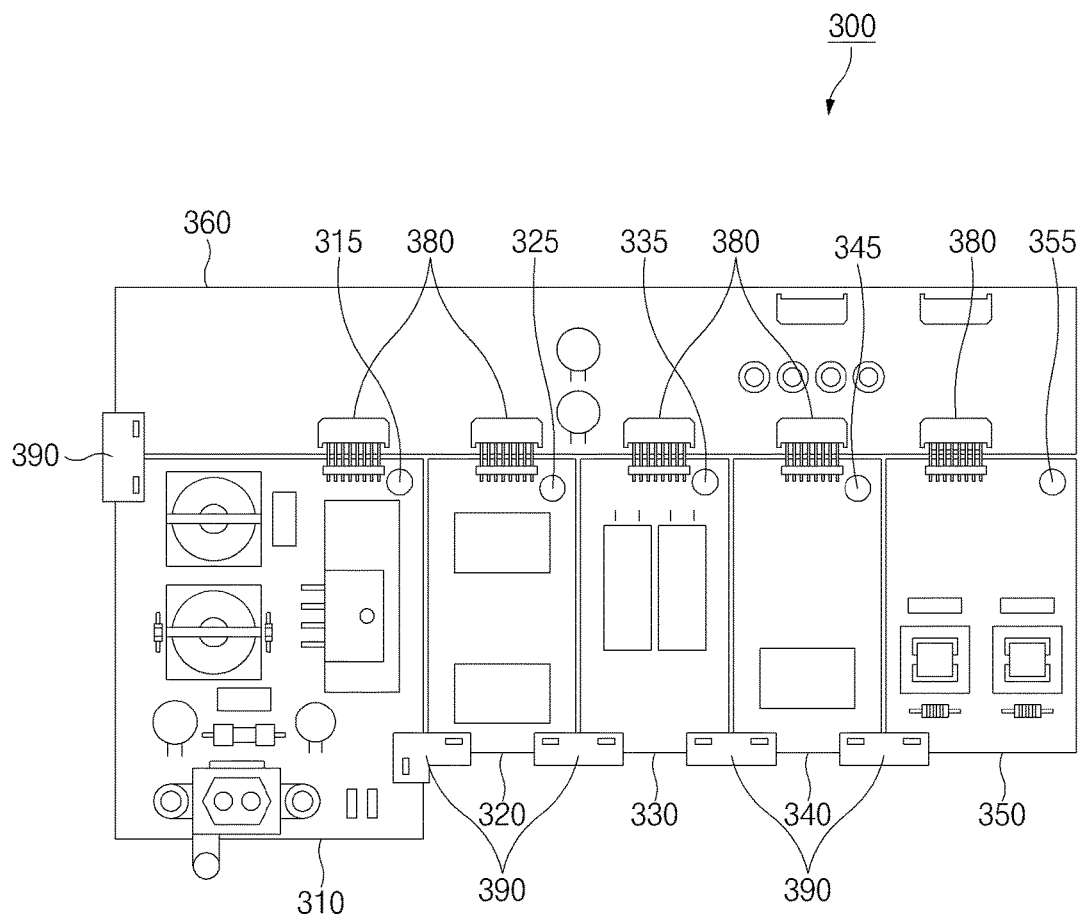
FIG. 4 is view illustrating a configuration of a power supply device illustrated in FIG. 3, according to an exemplary embodiment of the present disclosure.

FIG. 4 is view illustrating a configuration of a power supply device illustrated in FIG. 3, according to an exemplary embodiment of the present disclosure.

According to an exemplary embodiment, the power supply device 300 may include the first power module 310, the second power module 320, the third power module 330, the fourth power module 340, the fifth power module 350, the sixth power module 360, a connection member 380, and a fixing member 390.

According to an exemplary embodiment, the first power module 310 may include a power receiving circuit (not illustrated), an electromagnetic interference (EMI) filter (not illustrated), and a rectification circuit (or an AC/DC converter) (not illustrated), which are disposed on a PCB. According to an exemplary embodiment, a power receiving circuit may be connected to an external power source through a connector (not illustrated) and may receive power (e.g., AC power) from an external power source. The EMI filter may remove EMI generated by the power supply 300. The rectification circuit may convert the AC power received by power receiving circuit into DC power.

According to an exemplary embodiment, the second power module 320 may include a power factor correction circuit (not illustrated) disposed on the PCB. The power factor correction circuit (or a power factor corrector (PFC)) may adjust the power factor of the DC power rectified by the rectification unit to output the specified DC voltage.

According to an exemplary embodiment, the third power module 330 may include at least one electrolytic capacitor (not illustrated) disposed on the PCB. The electrolytic capacitor may be a smoothing capacitor. For example, the electrolytic capacitor may smooth the DC voltage output by the power factor correction circuit, to output the smoothed DC voltage.

According to an exemplary embodiment, the fourth power module 340 may include a DC/DC converter (not illustrated) disposed on the PCB. The DC/DC converter may convert the DC voltage into a specified voltage. For example, after converting the DC voltage output by the electrolytic capacitor into a voltage necessary to drive a display driving integrated circuit (IC) included in the fifth power module 350 or each of elements (e.g., a processor) included in an electronic device including the power supply device 300, the DC/DC converter may output the necessary voltage.

According to an exemplary embodiment, the fifth power module 350 may include a display driving IC (not illustrated) disposed on the PCB. According to an exemplary embodiment, the display driving IC may drive the display panel included in the electronic device by using the power input from the DC/DC converter.

According to an exemplary embodiment, the sixth power module 360 may include at least one capacitor 361 (e.g., Y capacitor) for reducing the EMI. For example, the electrical characteristic of the capacitor disposed in the sixth power module 360 may be determined depending on the EMI characteristic of the electronic device including the power supply device 300. For example, the capacitor may be electrically disposed between a primary line and a secondary line of the power supply device 300.

According to an exemplary embodiment, the sixth power module 360 may be electrically connected to the first power module 310, the second power module 320, the third power module 330, the fourth power module 340, and the fifth power module 350 through a plurality of the connection members 380. For example, a plurality of the connection members 380 may electrically connect the PCB included in the sixth power module 360 to the PCBs included in the first power module 310, the second power module 320, the third power module 330, the fourth power module 340, and the fifth power module 350. The power output by the first power module 310 may be input to the second power module 320 through the sixth power module 360. The power output by the second power module 320 may be input to the third power module 330 through the sixth power module 360. The power output by the third power module 330 may be input to the fourth power module 340 through the sixth power module 360. The power output by the fourth power module 340 may be input to the fifth power module 350 through the sixth power module 360.

According to an exemplary embodiment, the at least one fixing member 390 may fix the plurality of power modules 310, 320, 330, 340, 350, and 360 included in the power supply device 300. For example, the at least one fixing member 390 may be disposed in the periphery of the plurality of PCBs 311, 321, 331, 341, 351, and 361 illustrated in FIG. 3 and may fix the plurality of PCBs 311, 321, 331, 341, 351, and 361.

According to an exemplary embodiment, at least part of the plurality of power modules 310, 320, 330, 340, 350, and 360 may include an indicator that indicates the operating state of each of a plurality of power modules. For example, the first power module 310 may include a first indicator 315 connected to an output terminal. The second power module 320 may include a second indicator 325 connected to the output terminal. The third power module 330 may include a third indicator 335 connected to the output terminal. The fourth power module 340 may include a fourth indicator 345 connected to the output terminal. The fifth power module 350 may include a fifth indicator 355 connected to the output terminal. For example, each of the indicators may include a light emitting diode (LED). The LED may be turned on or off depending on the operating state of a module. For example, if a module operates normally, the power may be supplied to the LED, and then the LED may be turned on. If a module operates abnormally or does not operate, the power may not be supplied to the LED, and then the LED may be turned off.

According to the above-described exemplary embodiment, in the case where an error occurs in the operation of the power supply device 300, a user may easily determine which of the plurality of modules has failed, by using the indicator, and may easily repair the power supply device by replacing only the broken-down module. In addition, the power capacity of the power supply device may increase by arranging, in parallel, modules including an AC/DC converter or a DC/DC converter if necessary.

According to various exemplary embodiments of the present disclosure, a part of the plurality of power modules 310, 320, 330, 340, 350, and 360 illustrated in FIG. 4 may be omitted or a part of the plurality of power modules 310, 320, 330, 340, 350, and 360 may be implemented with one module. According to various exemplary embodiments, a part of elements included in one module may be disposed in another module.

According to various exemplary embodiments of the present disclosure, since at least part of elements included in the power supply device 300 is applied in common to various electronic devices, the power consumption each of which is similar to each other, the power supply device may be applied to various electronic devices only by changing the design of some configurations. For example, other modules, other than the fifth power module 350, from among modules illustrated in FIG. 4 may be designed or manufactured identically, and only the fifth power module 350 may be differently designed depending on the driving channel of a display device and depending on the display device. As such, the power supply device 300 may be applied to a low-priced display device operating by using the small number of channels (e.g., one channel) as well as a high-priced display device operating by using a lot of channels (e.g., 4 channels or 8 channels) in the display panel, only by changing the design of a part of elements.

Figure 5:
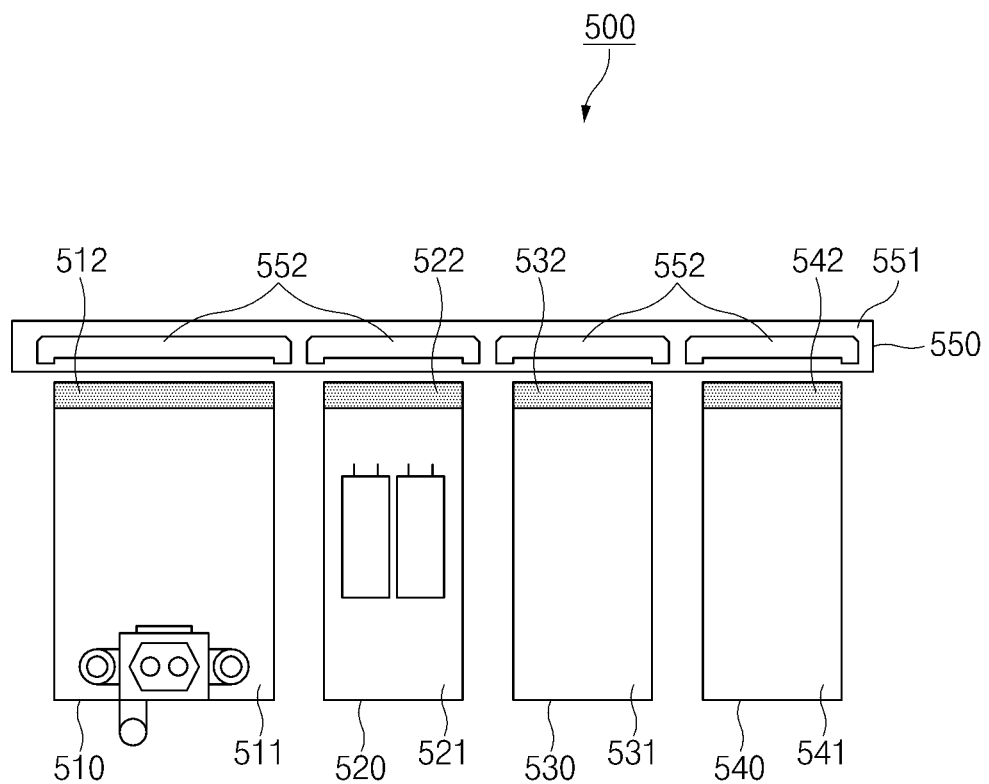
FIG. 5 is a view illustrating a structure of a power supply device, according to an exemplary embodiment of the present disclosure.

FIG. 5 is a view illustrating a structure of a power supply device, according to an exemplary embodiment of the present disclosure.

Referring to FIG. 5, a power supply device 500 may include a first power module 510, a second power module 520, a third power module 530, a fourth power module 540, and a fifth power module 550. According to an exemplary embodiment, a first PCB 511 of the first power module 510 may include a first connection part 512 for coupling the first PCB 511 of the first power module 510 to the fifth power module 550. A second PCB 521 of the second power module 520 may include a second connection part 522 for coupling the second PCB 521 of the second power module 520 to the fifth power module 550. A third PCB 531 of the third power module 530 may include a third connection part 532 for coupling the third PCB 531 of the third power module 530 to the fifth power module 550. A fourth PCB 541 of the fourth power module 540 may include a fourth connection part 542 for coupling the fourth PCB 541 of the fourth power module 540 the fifth power module 550. According to an exemplary embodiment, the fifth power module 550 may include a plurality of slots 552 on a fifth PCB 551.

According to an exemplary embodiment, the plurality of connection parts 512, 522, 532, and 542 may be inserted into the plurality of slots 552 included in the fifth power module 550, respectively. When the plurality of connection parts 512, 522, 532, 542 are inserted into the plurality of slots 552, the first power module 510, the second power module 520, the third power module 530, and the fourth power module 540 may be electrically connected to each other through the fifth power module 550.

Figure 6:
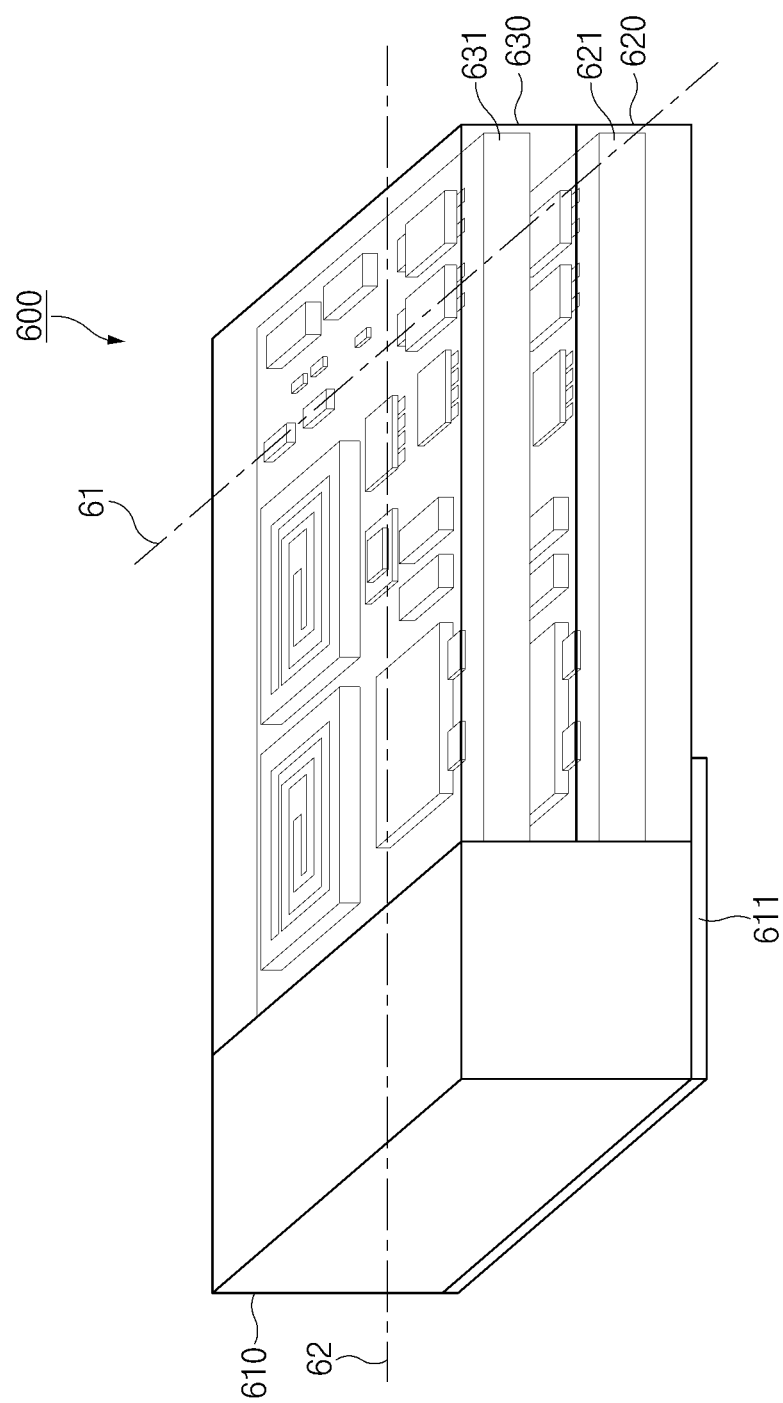
FIG. 6 is a view illustrating a structure of a power supply device, according to an exemplary embodiment of the present disclosure.

FIG. 6 is a view illustrating a structure of a power supply device, according to an exemplary embodiment of the present disclosure.

Referring to FIG. 6, a power supply device 600 may include a first power module 610, a second power module 620, and a third power module 630. The power supply device 600 illustrated in FIG. 6 may be connected to an electronic device (e.g., a display device) and may be an adapter device that supplies power to the electronic device. For example, the power supply device 600 may supply the power received from an external power source through a connector (not illustrated) to the electronic device. The first power module 610, the second power module 620, and the third power module 630 may include PCBs 611, 621, and 631, respectively and various circuits or modules may be disposed on the PCBs 611, 621, and 631. According to an exemplary embodiment, each of the PCBs 611, 621, and 631 may be a single-layer PCB or a multilayer PCB. For example, the first PCB 611 may be a single-layer PCB, the second PCB 621 may be a multilayer PCB, and the third PCB 631 may be a multilayer PCB. According to an exemplary embodiment, the first power module 610, the second power module 620, and the third power module 630 may be connected to each other through the first PCB 611, the second PCB 621, and the third PCB 631.

According to an exemplary embodiment, the first power module 610 may include an EMI filter (not illustrated) and a rectification circuit (not illustrated) that are disposed on the first PCB 611. According to an exemplary embodiment, the second power module 620 may include a power factor correction circuit (not illustrated) and an electrolytic capacitor (or a smoothing capacitor) (not illustrated) that are disposed on the second PCB 621. According to an exemplary embodiment, the third power module 630 may include a DC/DC converter (not illustrated) disposed on the third PCB 631. According to an exemplary embodiment, the output voltage of the DC/DC converter may be transmitted to an element (e.g., a display driving IC) included in the electronic device connected to the power supply device 600.

Figure 7A:
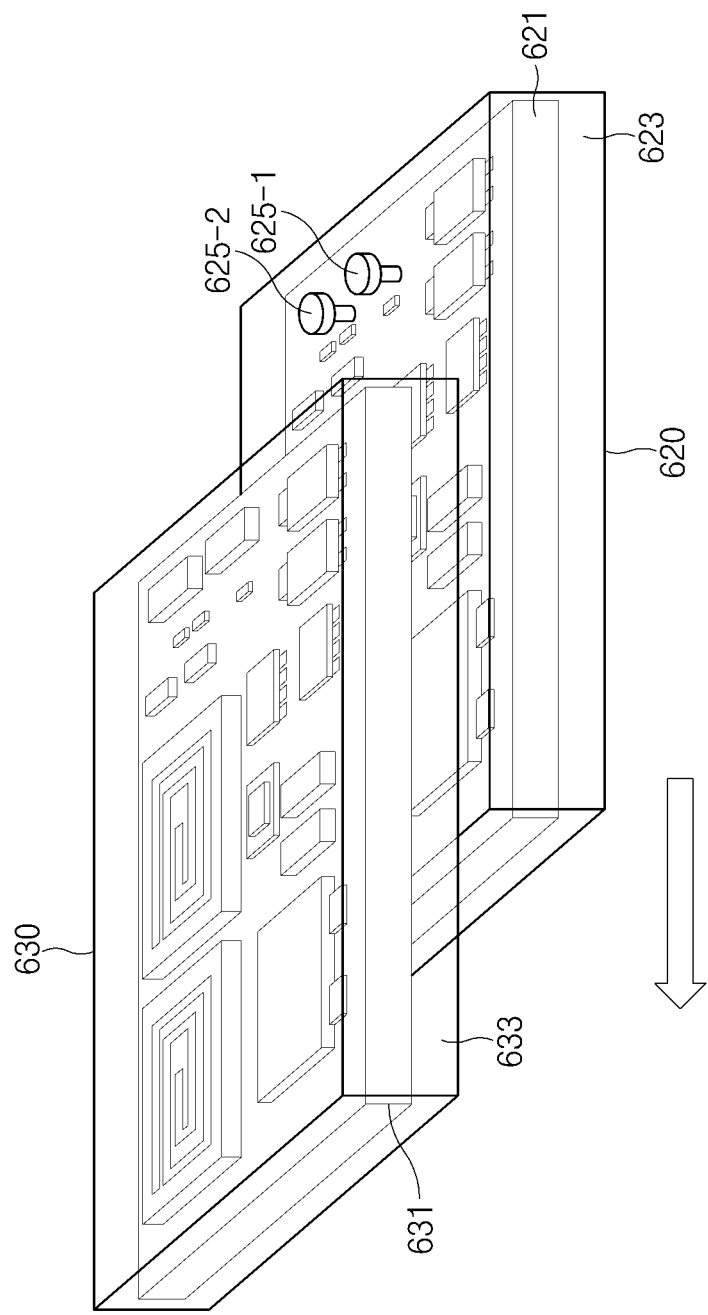
FIGS. 7A and 7B are views illustrating a coupling structure of a power supply device illustrated in FIG. 6.
Figure 7B:
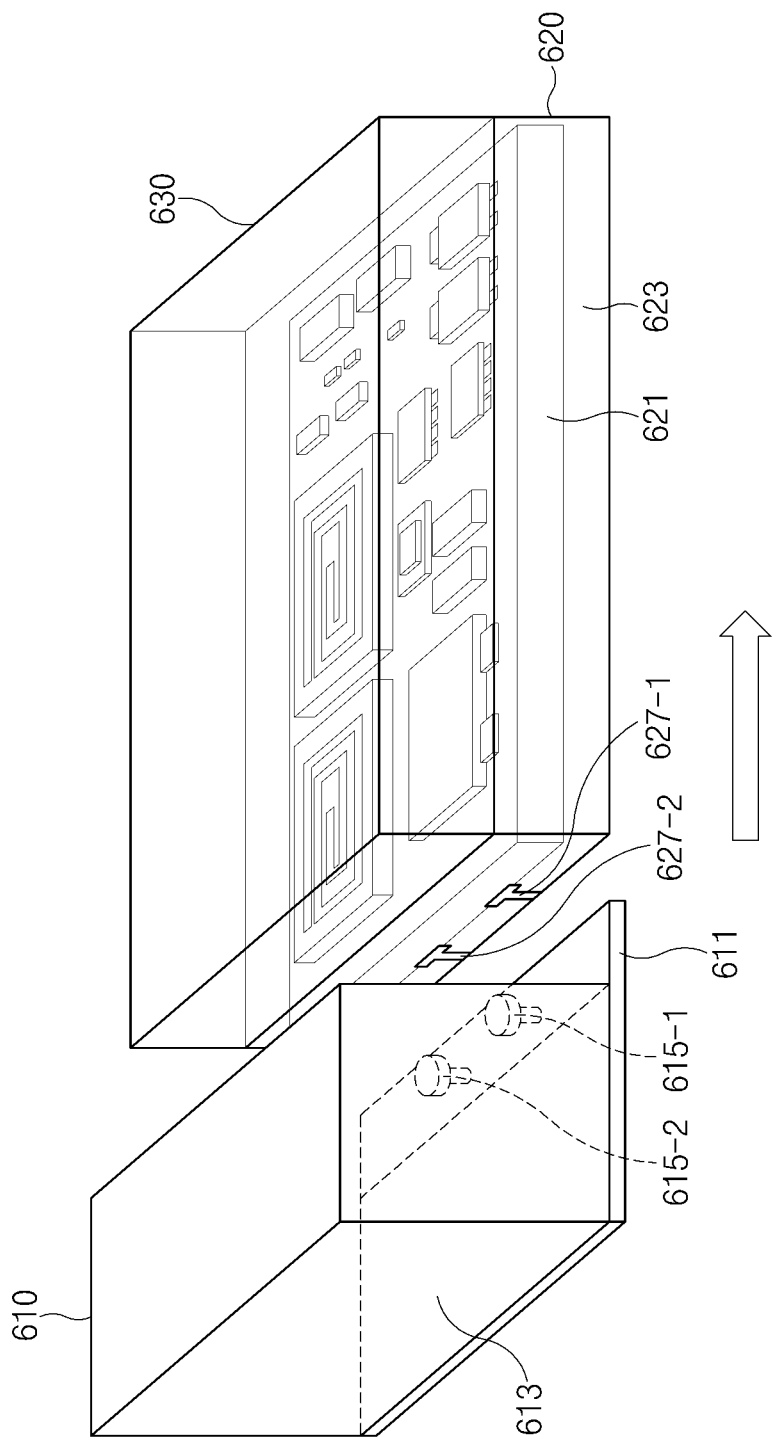

FIGS. 7A and 7B are views illustrating a coupling structure of a power supply device illustrated in FIG. 6.

Referring to FIG. 7A, the third power module 630 may be coupled to the upper surface of the second power module 620. According to an exemplary embodiment, the second power module 620 may include the second PCB 621 and a second housing 623 surrounding the second PCB 621. According to an exemplary embodiment, the second power module 620 may include a plurality of fixing pins 625-1 and 625-2 disposed on one surface (e.g., an upper surface) of the second PCB 621. For example, the plurality of fixing pins 625-1 and 625-2 may be electrically connected to the second PCB 621 and may be exposed to the outside of the second power module 620 through one surface (e.g., an upper surface) of the second housing 623. The one 625-1 of a plurality of fixing pins may be a positive terminal and the other 625-2 thereof may be a negative terminal.

According to an exemplary embodiment, the third power module 630 may include the third PCB 631 and a third housing 633 surrounding the third PCB 631. Although not illustrated in FIG. 7A, according to an exemplary embodiment, the third power module 630 may include a plurality of recesses that are formed over a surface (e.g., a lower surface) facing the second PCB 621 and one side surface (e.g., a right-side surface) connected to the surface facing the second PCB 621. For example, a plurality of recesses may be formed through the third PCB 631 and the third housing 633.

According to an exemplary embodiment, if the plurality of fixing pins 625-1 and 625-2 disposed in the second PCB 621 are inserted into the plurality of recesses formed in the third PCB 631, the second PCB 621 and the third PCB 631 may be electrically connected to each other. For example, the plurality of fixing pins 625-1 and 625-2 may be inserted into the plurality of recesses from a right-side direction of the third power module 630 to a left-side direction thereof.

Referring to FIG. 7B, the first power module 610 may be coupled to one side surface (e.g., a left-side surface) of each of the second power module 620 and the third power module 630. According to an exemplary embodiment, the first power module 610 may include a first housing 613 surrounding the first PCB 611 and a circuit or a module that is disposed on the first PCB 611. According to an exemplary embodiment, the first power module 610 may include a plurality of fixing pins 615-1 and 615-2 disposed on one surface (e.g., an upper surface) of the first PCB 611. For example, the plurality of fixing pins 615-1 and 615-2 may be disposed in an area in which the first housing 613 is not formed on the first PCB 611, and may be electrically connected to the first PCB 611. The one 615-1 of the plurality of fixing pins may be a positive terminal and the other 615-2 thereof may be a negative terminal.

According to an exemplary embodiment, the second power module 620 may include a plurality of recesses 627-1 and 627-2 that are formed over a surface (e.g., a lower surface) facing the first PCB 611 of the first power module 610 and one side surface (e.g., a left-side surface) connected to the surface facing the first PCB 611. For example, the plurality of recesses 627-1 and 627-2 may be formed through the second PCB 621 and the second housing 623.

According to an exemplary embodiment, if the plurality of fixing pins 615-1 and 615-2 disposed in the first PCB 611 are inserted into the plurality of recesses 627-1 and 627-2 formed in the second PCB 621, the first PCB 611 and the second PCB 621 may be electrically connected to each other. For example, the plurality of fixing pins 615-1 and 615-2 may be inserted into the plurality of recesses 627-1, 627-2 from the left-side direction of the second power module 620 to the right-side direction thereof.

According to various exemplary embodiments of the present disclosure, the first power module 610 may be disposed on the bottom surface of the second power module 620 as well as one side surface of each of the second power module 620 and the third power module 630. For example, the first power module 610 may be implemented similarly to the second power module 620 or the third power module 630 and may be disposed on the bottom surface of the second power module 620.

Figure 8:
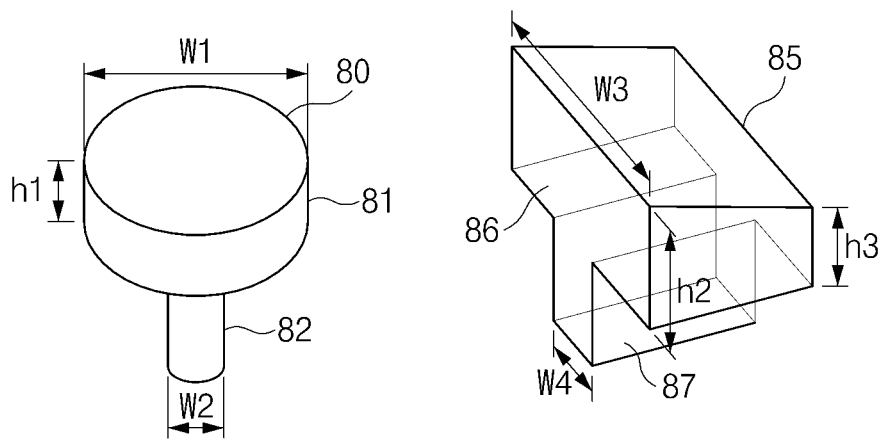
FIG. 8 is a view illustrating shapes of a fixing pin and a recess, according to an exemplary embodiment of the present disclosure.

FIG. 8 is a view illustrating shapes of a fixing pin and a recess, according to an exemplary embodiment of the present disclosure.

According to an exemplary embodiment, a fixing pin 80 may include a head part 81 and a body part 82. According to an exemplary embodiment, the head part 81 may have a first height h1. The height of the head part 81 may be constant or the height of the center part of the head part 81 may be higher than the height of the periphery of the head part 81. According to an exemplary embodiment, a width w1 of the head part 81 may be greater than a width w2 of the body part 82.

According to an exemplary embodiment, a recess 85 may include a first part 86 formed on a PCB and a second part 87 formed in housing. The first part 86 of the recess 85 may be an area into which the head part 81 of the fixing pin 80 is to be inserted, and the second part 87 may be an area into which the body part 82 of the fixing pin 80 is to be inserted. According to an exemplary embodiment, a width w3 of the first part 86 may be greater than a width w4 of the second part 87. According to an exemplary embodiment, the height of the first part 86 may be changed depending on the depth of the recess 85. For example, the first part 86 may have a second height h2 at the start point of the recess 85; as the recess 85 becomes deeper, the height may become smaller, and the first part 86 may have a third height h3 at the end point of the recess 85. The second height h2 may be higher than the first height h1, and the third height h3 may be lower than the first height h1.

Figure 9A:
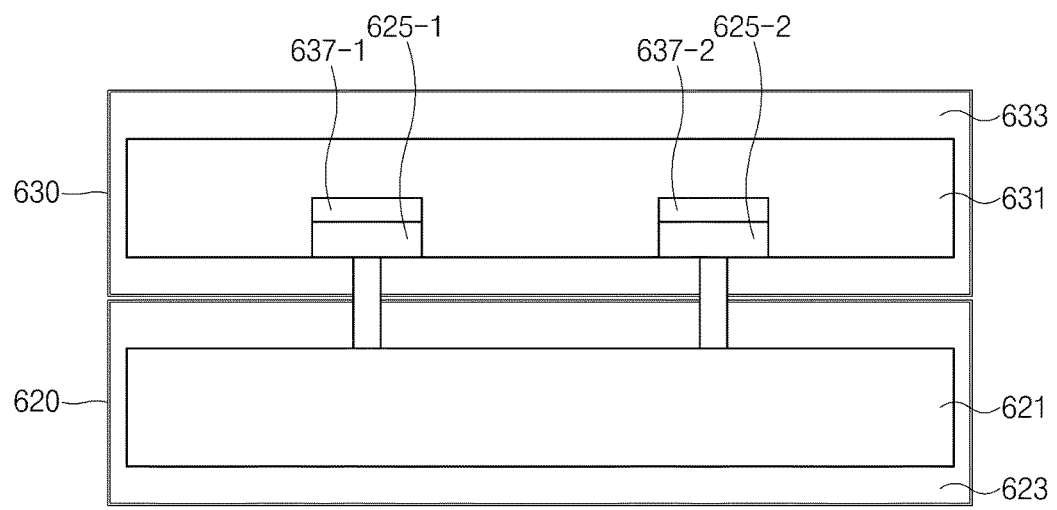
FIGS. 9A and 9B are views illustrating a coupling structure of a fixing pin and a recess, according to an exemplary embodiment of the present disclosure.
Figure 9B:
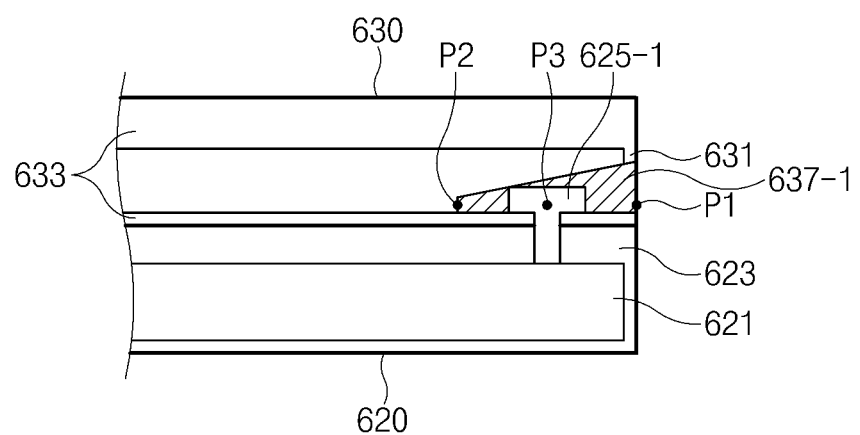

FIGS. 9A and 9B are views illustrating a coupling structure of a fixing pin and a recess, according to an exemplary embodiment of the present disclosure.

FIG. 9A illustrates an example of a sectional view taken along a line 61 across the power supply device 600 illustrated in FIG. 6 in a longitudinal direction. Referring to FIG. 9A, the second power module 620 may include the second PCB 621 and the second housing 623 surrounding the second PCB 621. According to an exemplary embodiment, the second power module 620 may include the plurality of fixing pins 625-1 and 625-2 disposed on one surface (e.g., an upper surface) of the second PCB 621.

According to an exemplary embodiment, the third power module 630 may include the third PCB 631 and the third housing 633 surrounding the third PCB 631. According to an embodiment, the third power module 630 may include a plurality of recesses 637-1 and 637-2 formed on a surface (e.g., a lower surface) facing the second PCB 621.

According to an exemplary embodiment, if the plurality of fixing pins 625-1 and 625-2 disposed in the second PCB 621 are inserted into the plurality of recesses 637-1 and 637-2 formed in the third PCB 631, the second PCB 621 and the third PCB 631 may be electrically connected to each other.

FIG. 9B illustrates a part of a sectional view taken along the line 62 across the power supply device 600 illustrated in FIG. 6 in a lateral direction. Referring to FIG. 9B, the second power module 620 may include the second PCB 621 and the second housing 623 surrounding the second PCB 621. According to an exemplary embodiment, the second power module 620 may include the fixing pin 625-1 disposed on one surface (e.g., an upper surface) of the second PCB 621.

According to an exemplary embodiment, the third power module 630 may include the third PCB 631 and the third housing 633 surrounding the third PCB 631. According to an exemplary embodiment, the third power module 630 may include the recess 637-1 formed on a surface (e.g., a lower surface) facing the second PCB 621. The recess 637-1 may be formed to have a specified depth from one side surface (e.g., a right-side surface) connected to the surface facing the second PCB 621. The height of first point P1 being the start point of the recess 637-1 may be higher than the height of the fixing pin 625-1, and the height of second point P2 being the end point of the recess 637-1 may be lower than the height of the fixing pin 625-1.

According to an exemplary embodiment, the fixing pin 625-1 may be inserted in a direction from first point P1 of the recess 637-1 to second point P2 thereof. As the depth at which the fixing pin 625-1 is inserted into the recess 637-1 becomes deeper, the height of the recess 637-1 may be reduced. According to an exemplary embodiment, the top surface of the recess 637-1 may be inclined as shown. According to another exemplary embodiment, the bottom surface the recess 637-1 may have a gradient (not shown) or both the top and the bottom surface the recess 637-1 may have a gradient (not shown). Accordingly, the fixing pin 625-1 may be fixed at third point P3 between first point P1 and second point P2.

According to an exemplary embodiment described with reference to FIG. 9B, the height of a recess may be reduced depending on the depth of the recess. Accordingly, the fixing pin may be stably fixed to the recess even though a manufacturing error occurs in the heights of the fixing pin and the recess or even though the height of the recess is changed due to repeated use.

While the present disclosure has been shown and described with reference to various exemplary embodiments thereof, it will be understood by those skilled in the art that various changes in form and details may be made therein without departing from the spirit and scope of the present disclosure as defined by the appended claims and their equivalents.

What is claimed is:

1. A power supply device comprising:
    a first power module comprising a first printed circuit board comprising a first protrusion part formed along a first side surface of the first printed circuit board facing a first direction;
    a second power module comprising a second printed circuit board comprising a first groove formed along a second side surface of the second printed circuit board facing the first side surface of the first printed circuit board in a second direction; and
    a third power module comprising a third printed circuit board configured to electrically connect the first printed circuit board and the second printed circuit board,
    wherein the first protrusion part is configured to be inserted into the first groove to physically connect the first printed circuit board to the second printed circuit board, and
    wherein the first power module and the second power module are arranged side by side parallel or coplanar to each other and are connected to each other.

2. The power supply device of claim 1, wherein the first groove is formed in an oblique direction with respect to an upper surface or a lower surface of the second printed circuit board.

3. The power supply device of claim 1, wherein the first printed circuit board is a single-layer printed circuit board,
    wherein the second printed circuit board is a multilayer printed circuit board, and
    wherein the third printed circuit board is a single-layer printed circuit board.

4. The power supply device of claim 1, wherein a dummy pattern is formed on at least one of an upper portion and a lower portion of the first groove inside the second printed circuit board.

5. The power supply device of claim 1, wherein the third power module comprises:
    at least one capacitor disposed on the third printed circuit board and configured to reduce electromagnetic interference (EMI).

6. The power supply device of claim 1, wherein the first power module comprises:
    at least one light emitting diode (LED) disposed on the first printed circuit board and configured to turn on or off based on an operating state of the first power module, and
    wherein the second power module comprises:
    at least one LED disposed on the second printed circuit board and configured to turn on or off based on an operating state of the second power module.

7. The power supply device of claim 1, further comprising:
    a fixing member coupled to the first printed circuit board and the second printed circuit board and configured to fixedly hold the first printed circuit board and the second printed circuit board.

8. The power supply device of claim 1, further comprising:
    a first connection member comprising a first conductive material and configured to electrically connect the first printed circuit board and the third printed circuit board; and
    a second connection member comprising a second conductive material and configured to electrically connect the second printed circuit board and the third printed circuit board.

9. The power supply device of claim 1, further comprising:
    a fourth power module comprising a fourth printed circuit board comprising a second protrusion part formed along a fourth side surface of the fourth printed circuit board facing a third side surface of the second printed circuit board,
    wherein the second printed circuit board further comprises a second groove formed along the third side surface facing a direction different from the second direction faced by the second side surface of the second printed circuit board, and
    wherein the second protrusion part is configured to be inserted into the second groove to connect the fourth printed circuit board to the second printed circuit board.

10. The power supply device of claim 9, wherein the fourth printed circuit board is a single-layer printed circuit board.

11. An electronic device comprising:
    a housing member configured to house the electronic device; a display exposed to the outside through the housing member; and a power supply device disposed inside the housing member and configured to supply power to the display,
    wherein the power supply device comprises:
    a first power module comprising a first printed circuit board having a first protrusion part formed along a first side surface of the first printed circuit board facing a first direction;
    a second power module comprising a second printed circuit board having a first groove formed along a second side surface of the second printed circuit board facing the first side surface of the first printed circuit board in a second direction; and a third power module comprising a third printed circuit board configured to electrically connect the first printed circuit board and the second printed circuit board, wherein the first protrusion part is configured to be inserted into the first groove to physically connect the first printed circuit board to the second printed circuit board, and wherein the first power module and the second power module are arranged side by side parallel or coplanar to each other and are connected to each other.

12. The electronic device of claim 11, wherein the display includes a curved display, and wherein the first groove is formed in an oblique direction with respect to an upper surface or a lower surface of the second printed circuit board.

13. The power supply device of claim 1, wherein the first protrusion part is a protrusion that is integrally formed along the first side surface of the first printed circuit board.

14. The power supply device of claim 13, wherein the first protrusion part is configured to be inserted directly into the first groove which is integrally formed on the second printed circuit board, and wherein the first printed circuit board is in direct physical contact with the second printed circuit board at the first protrusion part.

* * * * *